(12) United States Patent
Li et al.

(10) Patent No.: US 10,070,550 B2
(45) Date of Patent: Sep. 4, 2018

(54) FIXING DEVICE FOR CIRCUIT BOARD AND ELECTRONIC APPARATUS COMPRISING THE SAME

(71) Applicants: BOE TECHNOLOGY GROUP CO., LTD., Beijing (CN); K-TRONICS (SUZHOU) TECHNOLOGY CO., LTD., Suzhou, Jiangsu (CN)

(72) Inventors: Xiaolai Li, Beijing (CN); Zesen Fu, Beijing (CN)

(73) Assignees: BOE TECHNOLOGY GROUP CO., LTD., Beijing (CN); K-TRONICS (SUZHOU) TECHNOLOGY CO., LTD., Suzhou, Jiangsu Province (CN)

( * ) Notice: Subject to any disclaimer, the term of this patent is extended or adjusted under 35 U.S.C. 154(b) by 0 days.

(21) Appl. No.: 15/109,717

(22) PCT Filed: Jan. 8, 2016

(86) PCT No.: PCT/CN2016/070495
§ 371 (c)(1),
(2) Date: Jul. 5, 2016

(87) PCT Pub. No.: WO2016/138799
PCT Pub. Date: Sep. 9, 2016

(65) Prior Publication Data
US 2017/0006726 A1    Jan. 5, 2017

(30) Foreign Application Priority Data
Mar. 3, 2015   (CN) ..................... 2015 2 0123981 U

(51) Int. Cl.
*H05K 7/14*     (2006.01)
*H05K 5/00*     (2006.01)

(52) U.S. Cl.
CPC ......... *H05K 7/1417* (2013.01); *H05K 5/0017* (2013.01); *H05K 7/1404* (2013.01); *H05K 7/1427* (2013.01)

(58) Field of Classification Search
CPC .. H05K 7/1417; H05K 5/0017; H05K 7/1404; H05K 7/1427
See application file for complete search history.

(56) References Cited

U.S. PATENT DOCUMENTS 5,914,854 A * 6/1999 Holt ........................ G06F 1/184
                                                              361/679.23
2007/0211442 A1* 9/2007 Miller ................... H05K 7/1404
                                                              361/752
(Continued)

FOREIGN PATENT DOCUMENTS

CN          103364977 A       10/2013
CN          204031687 U       12/2014
(Continued)

OTHER PUBLICATIONS

International Search Report and Written Opinion dated Apr. 11, 2016; PCT/CN2016/070495.

*Primary Examiner* — Binh Tran
*Assistant Examiner* — Douglas Burtner
(74) *Attorney, Agent, or Firm* — Ladas & Parry LLP

(57) ABSTRACT

A fixing device for a circuit board and an electronic apparatus including the fixing device, related to the display field, and can be applied for the fixation of circuit boards with different sizes and structures onto a component to be fixed. The fixing device for a circuit board includes: a holding portion, used to hold a circuit board and including a containing space and a top portion including an opening allowing the circuit board to pass through the opening and to be inserted in the containing space; and a fixing portion, connected with the bottom portion of the holding portion (Continued)

and configured to fix on the display device. Also, an electronic apparatus including at least one fixing device for a circuit board is disclosed.

15 Claims, 6 Drawing Sheets

(56) References Cited

U.S. PATENT DOCUMENTS

| | | | |
|---|---|---|---|
| 2010/0214749 A1* | 8/2010 | Lee | H05K 7/1404 361/754 |
| 2011/0032682 A1* | 2/2011 | Hsu | H05K 5/0017 361/759 |
| 2012/0134123 A1* | 5/2012 | Hwang | H05K 7/1404 361/752 |
| 2014/0003020 A1* | 1/2014 | Huang | H05K 5/0204 361/807 |
| 2014/0022753 A1* | 1/2014 | Fu | G06F 1/186 361/807 |
| 2014/0104202 A1* | 4/2014 | Choi | H05K 5/0017 345/173 |
| 2014/0314514 A1* | 10/2014 | Paquette | H05K 7/1404 411/75 |
| 2016/0286666 A1* | 9/2016 | Mickmann | H02B 1/0523 |

FOREIGN PATENT DOCUMENTS

| | | |
|---|---|---|
| CN | 204090401 U | 1/2015 |
| CN | 204392729 A | 6/2015 |
| CN | 105223711 A | 1/2016 |

* cited by examiner

FIXING DEVICE FOR CIRCUIT BOARD AND ELECTRONIC APPARATUS COMPRISING THE SAME

TECHNICAL FIELD

The present disclosure relates to a display screen field, and particularly to a fixing device for a circuit board and an electronic apparatus comprising the fixing device.

BACKGROUND

An electronic apparatus having a display function, in addition to a display device, generally further comprises a circuit board connected with the display device, for example, a panel glass substrate printed circuit board (PCB) connected with the panel glass substrate of the display device. At present, there are many suppliers of panel glass substrate PCBs, and the suppliers have not adopted an uniform standard among them, thus the sizes and structures of the panel glass substrate PCBs are various; as a result, upon fixing the panel glass substrate PCBs, various fixing methods are needed to adapt to the panel glass substrate PCBs with different sizes and structures for example: the panel glass substrate PCB provided by a supplier A is suitable for adhesive fixation, while the panel glass substrate PCB provided by a supplier B is suitable for screw fixation; in this situation, the assembly compatibility is not good.

SUMMARY

In order to overcome the defects in the abovementioned state of art, the present disclosure provides a fixing device for a circuit board and an electronic apparatus comprising the same, so as to adapt to the fixation of circuit boards with different sizes and structures onto the display device.

In order to achieve the abovementioned purposes, the present disclosure adopts the following technical solutions:

A first aspect of the present disclosure provides a fixing device for a circuit board, which is configured to fix a circuit board onto a component to be fixed and comprises: a holding portion configured to hold the circuit board, wherein the holding portion comprises a containing space and a top portion, the top portion comprises an opening, so as to allow the circuit board to pass through the opening and to be inserted in the containing space; a fixing portion, wherein the fixing portion is connected with the bottom portion of the holding portion, and the fixing portion is configured to fix onto the component to be fixed.

Preferably, the containing space comprises a bottom portion and side walls; the bottom portion comprises a first side and a second side which are opposite to each other; the side walls comprise a first side wall and a second side wall which are opposite to each other, the first side wall is joined to the first side, and the second side wall is joined to the second side; the top portion comprises a first top portion and a second top portion which are separated from each other, the first top portion is joined to the first side wall, the second top portion is joined to the second side wall, and the opening of the top portion extends along an extending direction of the first side and the second side; a structure comprising the first side, the first side wall and the first top portion and a structure comprising the second side, the second side wall and the second top respectively hold two opposite edges of the circuit board.

Preferably, the holding portion is made of an elastic material; upon the holding portion being not held the circuit board, the size of the opening of the top portion of the holding portion is smaller than that of the containing spacer; upon the holding portion holding the circuit board, the size of the opening is enlarged to allow the circuit board to pass through the opening and to be inserted in the containing space; and after the holding portion holds the circuit board, the opening recovers so as to limit degree of freedom of the circuit board in the containing space.

Preferably, a scalable element is provided at a joint of the side walls and the bottom portion of the holding portion or at the bottom portion of the holding portion comprises; upon the holding portion being not held the circuit board, the size of the opening of the top portion of the holding portion is smaller than that of the containing space; upon the holding portion holding the circuit board, the scalable element stretches out and enlarges the size of the opening to allow the circuit board to be inserted in the containing space, and after the holding portion holds the circuit, the scalable element draws back and recovers the opening so as to limit degree of freedom of the circuit board in the containing space.

Preferably, the scalable element is of a continuous scalable type or a stepping scalable type.

Preferably, the scalable element comprises a lock structure, so as to lock the scalable element in a stretch state or a retraction state.

Preferably, the fixing portion and the component to be fixed are integrated.

Preferably, the fixing portion is detachably fixed onto the component to be fixed.

Preferably, the fixing portion comprises: a insertion head, configured to adapt to a mounting hole in the component to be fixed, wherein the insertion head can be inserted in the mounting hole; and a neck portion connecting the insertion head and the bottom portion of the holding portion, wherein after the insertion head is inserted in the mounting hole, an outer circumferential surface of the neck portion is rightly opposite to an inner surface of the mounting hole.

Preferably, the insertion head is made of an elastic material, and the size of the insertion head is larger than that of the mounting hole upon the insertion head being not acted by a force.

Preferably, a section shape of the mounting hole cut by a plane parallel to the top portion is a first quadrangle, a section shape of the insertion head cut by the plane parallel to the top portion is a second quadrangle, a length of the first quadrangle is larger than that of the second quadrangle, a width of the first quadrangle is larger than that of the second quadrangle, and the width of the first quadrangle is smaller than the length of the second quadrangle, and after the insertion head is inserted in the mounting hole and is rotated by an angle more than 0° and less than 180°, the insertion head and the mounting hole form a crossed structure.

Preferably, the size of the neck portion and the size of the mounting hole are matched.

Preferably, the length of the neck portion is same as the depth of the mounting hole.

A second aspect of the present disclosure provides an electronic apparatus, comprising at least one fixing device for a circuit board according to the first aspect and the possible implementations thereof.

In the fixing device for a circuit board and the electronic apparatus comprising the same provided by embodiments of the present disclosure, the fixing device comprises a holding portion and a fixing portion, the holding portion is configured to hold a circuit board, the fixing portion is connected with the holding portion and fixed onto a component to be fixed, the holding portion comprises a containing space and a top portion, the top portion comprises an opening allowing circuit boards with different sizes and structure to pass through the opening and to be inserted in the containing space, so as to achieve the purpose of holding the circuit board and adapt to the fixation of circuit boards with different sizes and structures onto the component to be fixed.

BRIEF DESCRIPTION OF THE DRAWINGS

In order to illustrate the technical solutions in the embodiments of the present disclosure or the existing arts more clearly, hereafter, the drawings need to be used in the description of the embodiments or the existing arts will be described simply, obviously, the drawings described below are only some embodiments of the present disclosure, for one ordinary skilled person in the art, other drawings can be obtained according to these drawings.

FIG. 2d is a schematic elevation view of the circle portion in FIG. 2a;

DRAWING REFERENCE NUMBERS

1—fixing device; 20—holding portion; 21—top portion; 21a—first top portion; 21b—second top portion; 22—bottom portion; 22a—first side; 22b—second side; 23—side wall; 23a—first side wall; 23b—second side wall; 24—scalable element; 24'—stretching portion; 24"—receiving portion; 25—lock structure; 5'—concave portion; 30—fixing portion; 31—insertion head; 32—neck portion; 2—back shell; 40—mounting hole; 3—circuit board; H—height direction of fixing device; L—length direction of fixing device; W—width direction of fixing device; S—containing space; E—opening; AA—first quadrangle; BB—second quadrangle.

DETAILED DESCRIPTION

In order to make the abovementioned purposes, technical features and advantages more obvious and understandable, hereafter, the technical solutions in the embodiments of the present disclosure will be clearly, completely described with reference to the drawings in the embodiments of the present disclosure. Obviously, the embodiments described are only a part of the embodiments, not all embodiments. Based on the embodiments in the present disclosure, all other embodiments obtained by one skilled in the art without paying inventive labor are within the protection scope of the present disclosure.

First Embodiment

Figure 1:
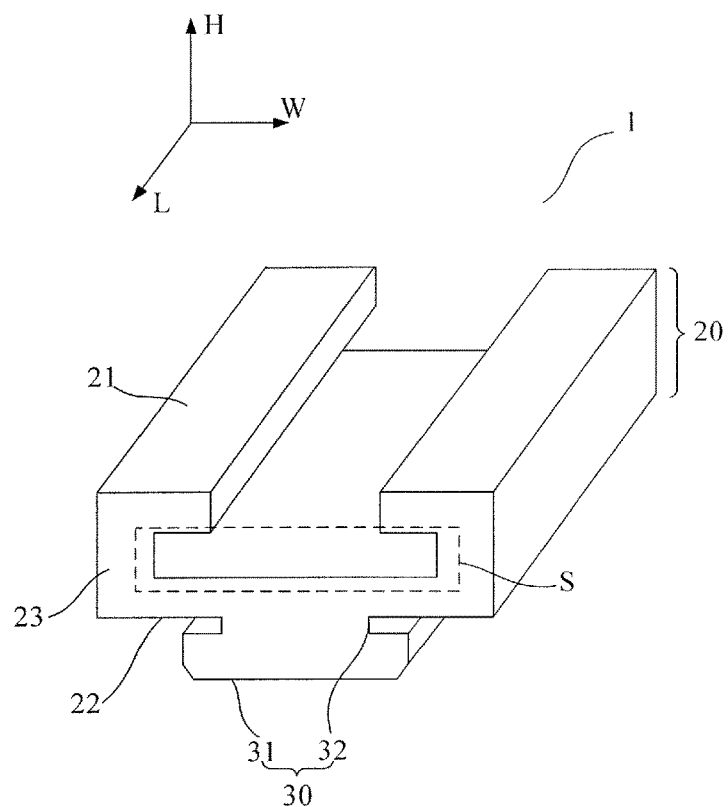
FIG. 1 is an elevation view of a fixing device for a circuit board provided by a first embodiment of the present disclosure.
Figure 2:
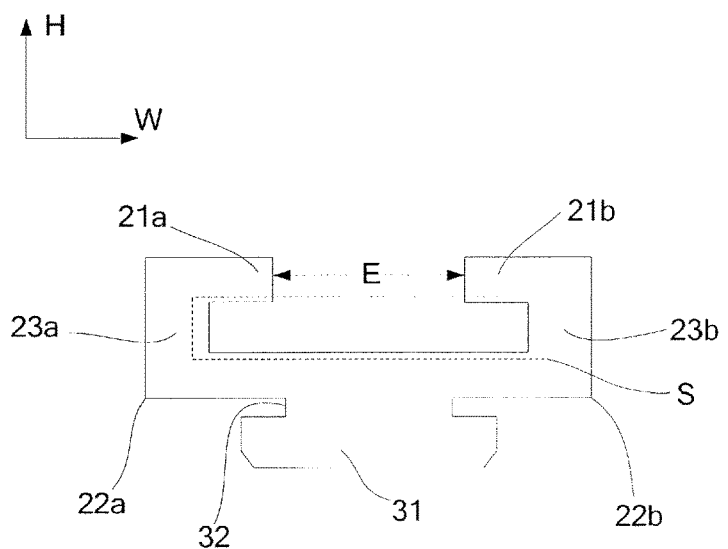
FIG. 2 is a side view along a length direction L of a fixing device for a circuit board provided by the first embodiment of the present disclosure.

As illustrated by FIGS. 1 and 2 (FIG. 1 is a elevation view of a fixing device for a circuit board provided by the first embodiment of the present disclosure, and FIG. 2 is a side view along a length direction L of the fixing device for a circuit board in FIG. 1), a fixing device 1 comprises a holding portion 20 and a fixing portion 30. The holding portion 20 is configured to hold a circuit board and comprises a containing space S and a top portion 21, the top portion 21 is provided with an opening E so as to allow the circuit board to pass through the opening E and to be inserted in the containing space S; the fixing portion 30 is connected with the bottom portion 22 of the holding portion 20, and the fixing portion 30 is fixed on the component to be fixed (not shown) so as to fix the circuit board held by the holding portion 20 onto the component to be fixed. It shall be noted that the abovementioned component to be fixed may be a display device or the like in an electronic apparatus, for example, it may be a back shell of a display device. The circuit board in the embodiments of the present disclosure may be a panel glass substrate PCB to be fixed onto the back shell of the display device.

After the circuit board is inserted into the containing space S, the holding portion 20 holds the circuit board from two ends to the center along the width direction W, so as to fix the circuit board in the containing space S, besides, the top portion 21 can limit the degrees of freedom of the circuit board in the height direction H together with the containing space S. The fixing portion 30 is connected with the bottom portion 22 of the holding portion 20, and the fixing portion 30 is capable of being fixed onto the component to be fixed (not shown), so as to fix the circuit board held by the holding portion 20.

In the fixing device for a circuit board provided by the present embodiment, because the containing space S is suitable for circuit boards with different sizes and structures, a circuit board can be inserted into the containing space S through the opening E so as to be fixed by the containing space S and the top portion 21, thus, after the fixing device is fixed onto the component to be fixed via the fixing portion 30, the fixation to circuit boards with different sizes and structures can be realized, such that the assembly compatibility for the circuit boards with different sizes and structures is improved.

Hereafter, referring to FIG. 1 and FIG. 2, the fixing device 1 of the first embodiment will be described more specifically.

In the embodiment, the containing space S may comprises a bottom portion 22 and side walls 23, the bottom portion 22 comprises a first side 22a and a second side 22b which are opposite to each other, the side walls 23 comprise a first side wall 23a and a second side wall 23b which are opposite to each other, the first side wall 23a is joined to the first side 22a, and the second side wall 23b is joined to the second side 22b. Besides, the top portion 21 is divided by the opening E and comprises a first top portion 21a and a second top portion 21b which are separated from each other. The first top portion 21a is joined to the first side wall 23a, and the second top portion 21b is joined to the second side wall 23b.

As seen from FIG. 2, the opening E extends along an extending direction L (i.e., a length direction L) of the first side 22a and the second side 22b. A structure formed with the bottom portion 22 (specifically, the first side 22a), the first side wall 23a and the first top portion 21a and a structure formed with the bottom portion 22 (specifically, the second side 22b), the second side wall 23b and the second top portion 21b respectively hold two opposite edges of the circuit board. That is to say, the two formed structures may be embodied as holding claws, which hold the circuit board from two ends to the center in the width direction W, so as to realize the fixation to circuit boards of different sizes and structures.

It shall be noted that, because the circuit board generally is a flat long strip shape, in order to match the shape of the circuit board and allow the containing space S to stably hold the circuit board, the containing space S, for example, may be configured as a flat long strip shape, too; that is to say that the size of the containing space S in the width direction may be larger than that in the height direction H, and the containing space S may extend in the length direction L. Certainly, the holding portion may not be limited to the form illustrated in FIGS. 1 and 2, thus, the containing space S may not be limited to the flat long strip shape illustrated in FIGS. 1 and 2, for example, the containing space S may be a circular arc shape or the other shapes.

Besides, the present embodiment only describe the fixing devices for a circuit board with the abovementioned exemplary structures as examples, in the other embodiments of the present disclosure, those skilled in the art can make variations and modifications on the basis of the design thought of the present disclosure, so as to obtain the fixing devices with other structures which can be applicable for circuit boards of different sizes and structures.

Second Embodiment

On the basis of the first embodiment, in order to further improve the assembly compatibility for the circuit boards of different sizes and structures, the technical solutions such as adding a scalable element 23 on the holding portion 20 or utilizing an elastic material to form the holding portion can be used to make the size of the opening E (i.e., a distance between the first top portion 21a and the second top portion 21b) of the fixing device 1 changeable in the width direction W.

Figure 2A:
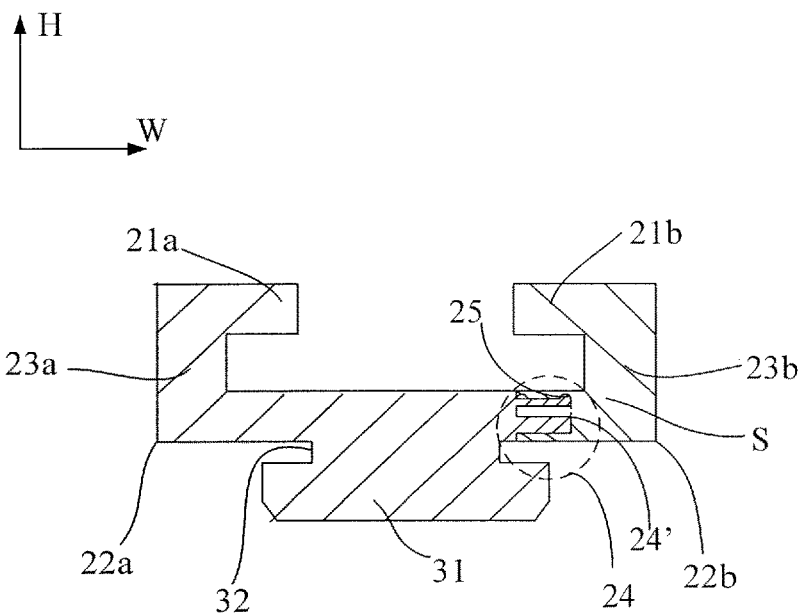
FIG. 2a is a sectional diagram of a fixing device for a circuit board provided by a second embodiment of the present disclosure, in which a scalable element of the fixing device is illustrated in a circle.
Figure 2B:
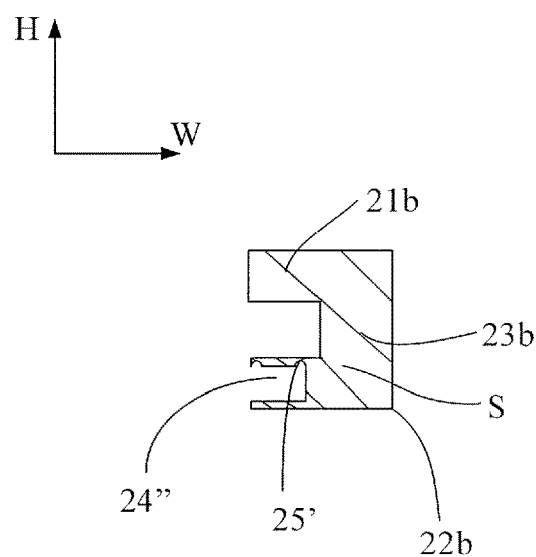
FIG. 2b is a view of a portion at the right side of the fixing device according to FIG. 2a, in which only a receiving portion of the scalable element is illustrated.

First, the abovementioned technical solution of adding a scalable element 23 will be described. For example, a scalable element 24 can provided at the joint between the side walls 23 of the holding portion 20 and the bottom portion 22 or at the bottom portion 22 of the holding portion 20 so as to allow the scalable element 24 to stretch out and draw back in the width direction W; in this way, the size of the bottom portion 22 in the width direction W can become larger or smaller, bring the side walls 23 and the top portions 21 connected to the side walls to move in the width direction, and correspondingly the size of the opening E can become larger or smaller in the width direction W, and therefore the circuit boards with different sizes and structures can pass through the opening E, enter and be held in the containing space S. As an exemplary example, the scalable element 24 can be formed to comprise a stretching portion 24' formed in a portion (for example, a left side portion in the circle illustrated in FIG. 2a) of the bottom portion 22 of the holding portion 20 and a receiving portion 24" formed in another portion (for example, a right side portion in the circle illustrated in FIG. 2a).

Figure 2C:
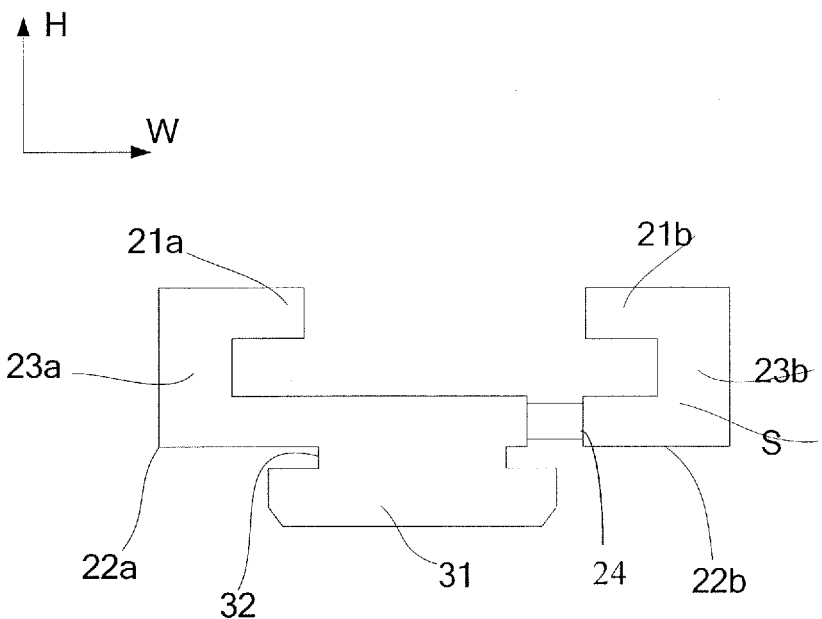
FIG. 2c is schematic diagram of the fixing device in FIG. 2a when the scalable element is in a stretched state.
Figure 2D:
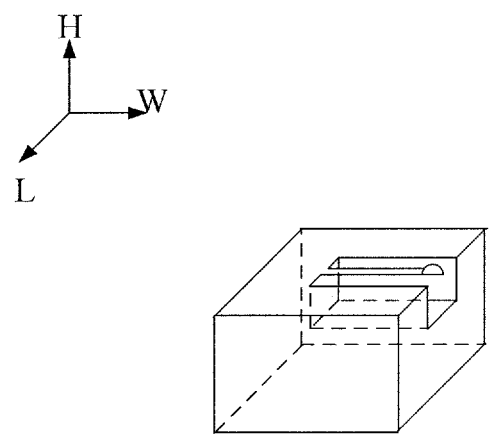

Specifically, upon the holding portion 20 being not held a circuit board, the size of the opening E of the top portion 21 of the holding portion 20 (specifically, a distance between the first top portion 21a and the second to portion 21b) is smaller than that of the containing space S; upon the holding 20 holding the circuit board, the scalable element 24 stretches out and enlarges the size of the opening E to allow the circuit board to be inserted into the containing space S. As illustrated by FIG. 2c, after the holding portion 20 holds the circuit board, the scalable element 24 draws back and recovers the opening E, so as to limit the degrees of freedom of the circuit board in the containing space.

It shall be noted that, the present disclosure does not specifically define the scalable mechanism of the scalable element 24, which may be of a continuous scalable type or a stepping scalable type. Besides, for example, a lock structure 25 formed as a protrusion shape can be provided on the stretching portion 24' of the scalable element 24, so as to lock the scalable element 24 in a stretch state or a retraction state.

Due to the configuration of the scalable element 24, the holding portion 20 and the scalable element 24 are used cooperatively to make the opening E and the containing space S both have flexible size variability, so as to improve the assembly compatibility for the fixing device 1 for the circuit boards of different sizes and structures; besides, the scalable element may be applied with an elastic force to hold the circuit board more stably.

In the present embodiment, the holding portion 20 may not be provided with a scalable element, but an elastic material is utilized to form the holding portion 20. The elasticity of the holding portion 20 itself is utilized to realize the variability of the size of the opening E in the width direction W (specifically a distance between the first top portion 21a and the second top portion 21b), so as to allow circuit boards with different sizes and structures to enter and to be fixed in the containing space S through the opening E.

In this case, upon the holding portion 20 being not held a circuit board, the size of the opening E (specifically a distance between the first top portion 21a and the second top portion 21b) is smaller than that of the containing space S; upon the holding portion 20 holding the circuit board, the size of the opening E is enlarged to allow the circuit board to be inserted in the containing space S, and after the holding portion 20 holds the circuit board, the opening E recovers, so as to limit the degrees of freedom of the circuit board in the containing space S.

Because when the holding portion 20 is made of an elastic material, both the opening E and the containing space S have relatively flexible size variability, the assembly compatibility of the fixing device 1 for the circuit boards of different sizes and structures can be improved. Besides, the elastic force of the elastic material can hold the circuit board more stably, and for example, the elastic material may be rubber.

Third Embodiment

On the basis of the first embodiment or the second embodiment, the connection manner of the fixing portion 30 of the fixing device 1 and the display device are described in detail.

Figure 3:
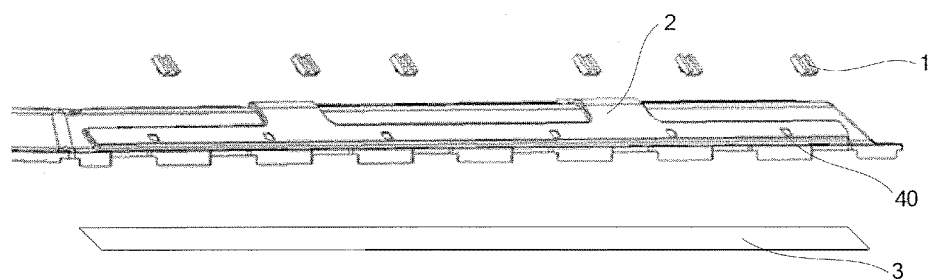
FIG. 3 is a partial plan view of the fixing device for a circuit board provided by a third embodiment before fixing the circuit board onto the display device.
Figure 4:
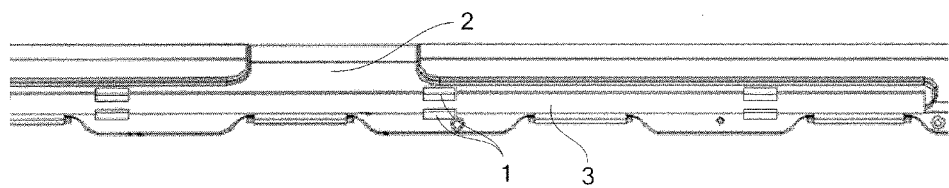
FIG. 4 is a partial plan view of the fixing device for a circuit board provided by the third embodiment after fixing the circuit board onto the display device.
Figure 5:
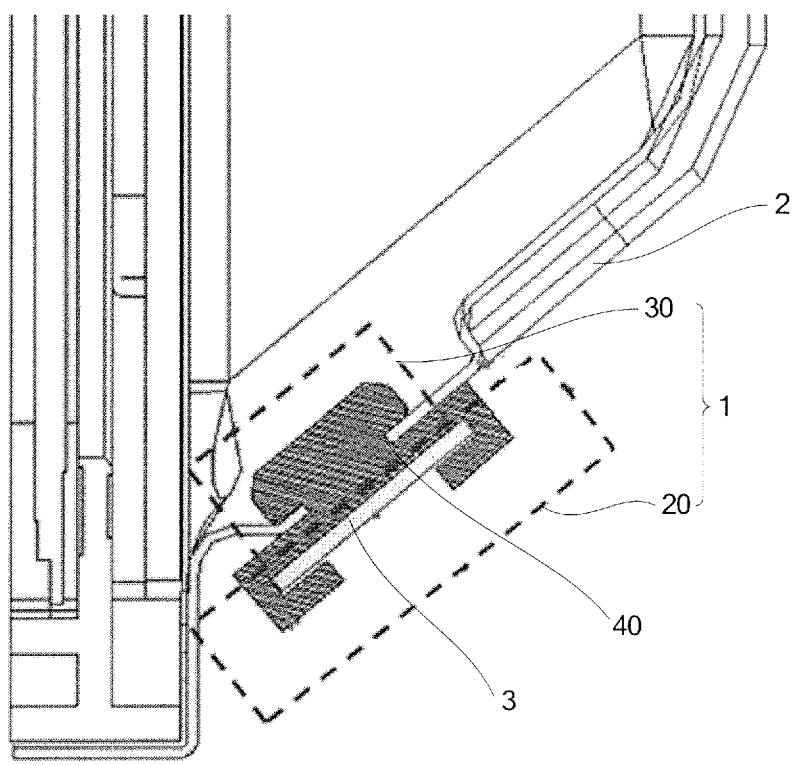
FIG. 5 is a partial sectional diagram of the fixing device for a circuit board provided by the third embodiment of the present disclosure after fixing the circuit board onto the display device.

As illustrated by FIGS. 3, 4 and 5, referring to FIGS. 1 and 2, the fixing portion 30 of the fixing device 1 in the present embodiment may be detachably fixed onto the display device. In the present embodiment, the fixing portion 30 may comprise: an insertion head 31 used to adapt to a mounting hole 40 on the display device; and a neck portion connecting the insertion head 31 and the bottom portion 22 of the holding portion 20. The insertion head 31 can be inserted in the mounting hole 40. After the insertion head 31 is inserted in the mounting hole 40, the outer circumferential surface of the neck portion 32 is rightly opposite to the inner surface of the mounting hole 40. In this way, the connection and separation between the fixing device 1 and the display device can be realized by the actions of pulling and inserting, the fixing method is simple and convenient for dismounting. Besides, the fixation of the circuit board 3 can be conveniently completed by merely using a insertion head 31 matching with the mounting hole 40 of the display device. For example, even if the circuit board 3 does not match with the display device, the circuit board and the display device can be still conveniently fixed without changing the circuit board 3 or the display device.

It shall be understood that, due to the configuration of the neck portion 32, the insertion head 31 inserted in the mounting hole 40 is locked at the neck portion 32, which improves the stability of the connection between the fixing portion 30 and the display device. The size of the neck portion 32 may match with that of the mounting hole 40, for example, the size of the neck portion is slightly smaller than that of the mounting hole 40 so as to guarantee that the neck portion 32 can be inserted through the mounting hole 40 and also the waggle of the circuit board that has been mounted can be better prevented. Moreover, the length of the neck portion 32 (i.e., a distance from the contacting surface between the insertion head 31 and the neck portion 32 to the bottom portion 22 of the holding portion 20) can be equal to the depth of the mounting hole 40, such that the insertion head 31 and the holding portion 20 can tightly contact the two outer side surfaces of the mounting hole 40 respectively, and the stability of the fixation of the fixing portion 30 in the mounting hole 40 can be improved, furthermore, the stability of the circuit board on the component to be fixed can be improved. In the present embodiment, the shapes of the neck portion 32 and the mounting hole 40 may be circle shapes, ellipse shapes, polygons or other irregular shapes.

Preferably, the insertion head 31 may be made of an elastic material, and upon being not acted by a force, the size of the insertion head 31 is larger than that of the mounting hole 40, such that, due to the action of elastic force, it is more stable after the insertion head 31 made of an elastic material is inserted in the mounting hole 40.

Figure 6:
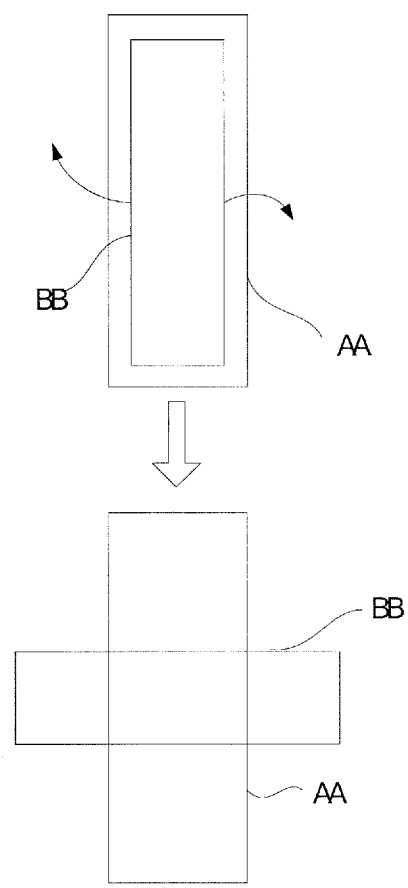
FIG. 6 is an assembly schematic diagram of an insertion head of the fixing device for a circuit board and a mounting hole of a component to be fixed according to the third embodiment of the present disclosure.

If the material for forming the insertion head 31 is not limited, in order to prevent the insertion head 31 from falling out after it is inserted in the mounting hole 40, the shape of the mounting hole 40 and the insertion head 31 can be designed. Specifically, as illustrated by FIG. 6, the section shape of the mounting hole 40 cut by a plane parallel to the top portion 21 (a plane located in the length direction L and the width direction W) is a first quadrangle AA, the section shape of the insertion head 31 cut by a plane parallel to the top portion 21 is a second quadrangle BB, and the length of the first quadrangle AA is larger than that of the second quadrangle BB, and the width of the first quadrangle AA is smaller than that of the second quadrangle BB. After the insertion head 31 is inserted in the mounting hole 40 and is rotated by an angle larger than 0° but smaller than 180°, the insertion head 31 and the mounting hole 40 form a crossed structure, for example, the insertion head 31 may be rotated by 90°, at this time, the formed structure with a crossed shape can better prevent the insertion head 31 from falling out from the mounting hole 40. At this time, the insertion head 31 may be formed of a material without elasticity. It shall be noted that the insertion head and the neck portion may be detachably connected or may be integrated together, as long as the holding portion 20 can hold the circuit board 3 after the fixing portion 30 of the fixing device is fixed onto the back shell 2 of the display device.

In the present embodiment, for example, the mounting hole 40 of the display device may be disposed on the back shell 2 of the display device, so as to allow the circuit board 3 to be fixed on the back surface of the display device. In order to improve the stability of the fixation of the circuit board 3, for example, more mounting holes 40 can be disposed, and the mounting holes 40 can be disposed at an equal interval in a straight line, and the straight line is parallel to an extending direction of the circuit board 3.

Certainly, the fixing portion 30 of the fixing device and the display device may be integrated such that the fixing device 1 can be connected with the display device more stably, and also the entire structure of the display device can be simplified.

Fourth Embodiment

The present embodiment provides an electronic apparatus, which comprises the fixing device 1 for a circuit board provided by any of the first to third embodiments, the electronic apparatus can be applied to the fixation of circuit boards of different sizes and structures.

The electronic apparatus provided by the present embodiment further comprises a display device, and the display device may be a liquid crystal panel, an electronic paper, an OLED (Organic Light-Emitting Diode) panel or other types of display panels. Furthermore, the electronic apparatus provided by the present embodiment may be a cell phone, a flat plate computer, a television, a display device, a notebook, a digital frame, a navigator or any other products or components having a display function.

The foregoing are merely specific embodiments of the invention, but not limitative to the protection scope of the invention. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

What is claimed is:

1. A fixing device for a circuit board, configured to fix a circuit board onto a component to be fixed and comprising:
    a holding portion, configured to hold the circuit board, wherein the holding portion comprises a containing space and a top portion, the top portion comprises an opening allowing the circuit board to pass through the opening to be inserted in the containing space;
    a fixing portion, wherein the fixing portion is connected with the bottom portion of the holding portion, and the fixing portion is configured to fix onto the component to be fixed,
    wherein the fixing portion is detachably fixed onto the component to be fixed, the fixing portion comprises: a insertion head, configured to adapt to a mounting hole in the component to be fixed, wherein the insertion head can be inserted in the mounting hole; and a neck portion connecting the insertion head and the bottom portion of the holding portion, wherein after the insertion head is inserted in the mounting hole, an outer circumferential surface of the neck portion is rightly opposite to an inner surface of the mounting hole,
    wherein a section shape of the mounting hole cut by a plane parallel to the top portion is a first quadrangle, a section shape of the insertion head cut by the plane parallel to the top portion is a second quadrangle, a length of the first quadrangle is larger than that of the second quadrangle, a width of the first quadrangle is larger than that of the second quadrangle, and the width of the first quadrangle is smaller than the length of the second quadrangle, and after the insertion head is inserted in the mounting hole and is rotated by an angle more than 0° and less than 180°, the insertion head and the mounting hole form a crossed structure.

2. The fixing device for a circuit board according to claim 1, wherein a size of the neck portion and a size of the mounting hole are matched.

3. The fixing device for a circuit board according to claim 1, wherein a length of the neck portion is same as a depth of the mounting hole.

4. An electronic apparatus comprising at least one fixing device for a circuit board, which is configured to fix a circuit board onto a component to be fixed and comprises:
   a holding portion, configured to hold the circuit board, wherein the holding portion comprises a containing space and a top portion, the top portion comprises an opening allowing the circuit board to pass through the opening to be inserted in the containing space; and
   a fixing portion, wherein the fixing portion is connected with the bottom portion of the holding portion, and the fixing portion is configured to fix onto the component to be fixed,
   wherein the fixing portion is detachably fixed onto the component to be fixed, the fixing portion comprises: a insertion head, configured to adapt to a mounting hole in the component to be fixed, wherein the insertion head can be inserted in the mounting hole; and a neck portion connecting the insertion head and the bottom portion of the holding portion, wherein after the insertion head is inserted in the mounting hole, an outer circumferential surface of the neck portion is rightly opposite to an inner surface of the mounting hole,
   wherein a section shape of the mounting hole cut by a plane parallel to the top portion is a first quadrangle, a section shape of the insertion head cut by the plane parallel to the top portion is a second quadrangle, a length of the first quadrangle is larger than that of the second quadrangle, a width of the first quadrangle is larger than that of the second quadrangle, and the width of the first quadrangle is smaller than the length of the second quadrangle, and after the insertion head is inserted in the mounting hole and is rotated by an angle more than 0° and less than 180°, the insertion head and the mounting hole form a crossed structure.

5. The electronic apparatus according to claim 4, wherein the containing space comprises a bottom portion and side walls, and the bottom portion comprises a first side and a second side which are opposite to each other;
   the side walls comprise a first side wall and a second side wall which are opposite to each other, the first side wall is joined to the first side, the second side wall is joined to the second side;
   the top portion comprises a first top portion and a second portion which are separated from each other, the first top portion is joined to the first side wall, the second top portion is joined to the second side wall, and the opening of the top portion extends along an extending direction of the first side and the second side;
   a structure comprising the first side, the first side wall and the first top portion and a structure comprising the second side, the second side wall and the second top portion are configured to respectively hold two opposite edges of the circuit board.

6. The electronic apparatus according to claim 4, wherein the holding portion is made of an elastic material;
   upon the holding portion not holding the circuit board, a size of the opening of the top portion of the holding portion is smaller than that of the containing spacer;
   upon the holding portion holding the circuit board, the size of the opening is enlarged to allow the circuit board to pass through the opening and to be embedded in the containing space; and
   after the holding portion holds the circuit board, the opening recovers so as to limit degree of freedom of the circuit board in the containing space.

7. The electronic apparatus according to claim 4, wherein the insertion head is made of an elastic material, and a size of the insertion head is larger than that of the mounting hole upon the insertion head being not acted by a force.

8. The fixing device for a circuit board according to claim 1, wherein the containing space comprises a bottom portion and side walls, and the bottom portion comprises a first side and a second side which are opposite to each other;
   the side walls comprise a first side wall and a second side wall which are opposite to each other, the first side wall is joined to the first side, the second side wall is joined to the second side;
   the top portion comprises a first top portion and a second portion which are separated from each other, the first top portion is joined to the first side wall, the second top portion is joined to the second side wall, and the opening of the top portion extends along an extending direction of the first side and the second side;
   a structure comprising the first side, the first side wall and the first top portion and a structure comprising the second side, the second side wall and the second top portion are configured to respectively hold two opposite edges of the circuit board.

9. The fixing device for a circuit board according to claim 1, wherein the holding portion is made of an elastic material;
   upon the holding portion not holding the circuit board, a size of the opening of the top portion of the holding portion is smaller than that of the containing spacer;
   upon the holding portion holding the circuit board, the size of the opening is enlarged to allow the circuit board to pass through the opening and to be embedded in the containing space; and
   after the holding portion holds the circuit board, the opening recovers so as to limit degree of freedom of the circuit board in the containing space.

10. The fixing device for a circuit board according to claim 8, wherein a scalable element, provided at a joint between the side wall and the bottom portion of the holding portion or at the bottom portion of the holding portion,
    wherein, upon the holding portion not holding the circuit board, a size of the opening of the top portion of the holding portion is smaller than that of the containing space;
    upon the holding portion holding the circuit board, the scalable element stretches out and enlarges the size of the opening to allow the circuit board to be inserted in the containing space, and after the holding portion holds the circuit, the scalable element draws back and recovers the opening so as to limit degree of freedom of the circuit board in the containing space.

11. The fixing device for a circuit board according to claim 10, wherein the scalable element is of a continuous scalable type or a stepping scalable type.

12. The fixing device for a circuit board according to claim 10, wherein the scalable element comprises a lock structure so as to lock the scalable element in a stretch state or a retraction state.

13. The fixing device for a circuit board according to claim 1, wherein the fixing portion and the component to be fixed are integrated.

14. The fixing device for a circuit board according to claim 1, wherein the insertion head is made of an elastic material, and a size of the insertion head is larger than that of the mounting hole upon the insertion head being not acted by a force.

15. The electronic apparatus according to claim 5, wherein a scalable element is provided at a joint between the side wall and the bottom portion of the holding portion or at the bottom portion of the holding portion;
   upon the holding portion not holding the circuit board, a size of the opening of the top portion of the holding portion is smaller than that of the containing space;
   upon the holding portion holding the circuit board, the scalable element stretches out and enlarges the size of the opening to allow the circuit board to be inserted in the containing space, and after the holding portion holds the circuit, the scalable element draws back and recovers the opening so as to limit degree of freedom of the circuit board in the containing space.

* * * * *